United States Patent [19]

Nelson, Jr.

[11] 4,178,631

[45] Dec. 11, 1979

[54] DIGITAL PHASE DETECTOR AND METHOD

[75] Inventor: Robert L. Nelson, Jr., Austin, Tex.

[73] Assignee: Tractor, Inc., Austin, Tex.

[21] Appl. No.: 877,259

[22] Filed: Feb. 13, 1978

[51] Int. Cl.$^2$ .................. G06F 15/20; H03D 13/00
[52] U.S. Cl. ............................. 364/484; 324/83 D;
                                               328/133; 328/155
[58] Field of Search ............... 364/481, 483, 484, 721;
          307/232; 324/83 D, 83 Q; 328/14, 133, 134, 155

[56] References Cited

U.S. PATENT DOCUMENTS

| | | | |
|---|---|---|---|
| 3,582,780 | 6/1971 | Hole | 324/83 D |
| 3,599,102 | 8/1971 | Mous | 328/133 |
| 3,665,469 | 5/1972 | Williams | 328/155 X |
| 3,818,477 | 6/1974 | Odams | 343/105 LS |
| 3,849,671 | 11/1974 | Molack | 328/133 X |
| 3,925,654 | 12/1975 | Roantree et al. | 328/14 |
| 3,984,771 | 10/1976 | Nossen et al. | 324/83 D |
| 3,989,931 | 11/1976 | Phillips | 324/83 D X |
| 4,001,682 | 1/1977 | Watt | 324/83 D |
| 4,021,653 | 5/1977 | Sharp et al. | 364/484 X |
| 4,025,848 | 5/1977 | Delagrange et al. | 324/83 D |
| 4,031,478 | 6/1977 | Clark | 328/134 |

OTHER PUBLICATIONS

Drogin, "Steering a Course to Safer Air Travel", *Electronics,* Nov. 27, 1967, pp. 95–102.
Pasternack & Whalin, "Analysis and Synthesis...For FM Demodulation" *Bell System Technical Journal,* Dec. 1968, pp. 2207–2237.
Mactaggart, "Design and Performance of CMA-719 Computerized Airborne Omega Receiver", pp. 63–74.

*Primary Examiner*—Jerry Smith
*Attorney, Agent, or Firm*—Arnold, White & Durkee

[57] ABSTRACT

A digital phase detector includes a hard limiter which transforms an incoming signal of known frequency into a binary signal at the same frequency. A reference generator produces two binary references at the signal frequency, one reference shifted 90° in phase with respect to the other. The binary signal is exclusive-ORed with each reference and the exclusive-OR outputs therefrom control two counters, the counters thereby registering counts analogous to trigonometric functions of the signal phase angle. A phase modulated clock drives the counters, the phase modulation feature permitting a correction factor to be incorporated in order to cancel the error introduced by the quantized nature of the digital computations involved.

17 Claims, 5 Drawing Figures

U.S. Patent  Dec. 11, 1979  Sheet 1 of 3  4,178,631
FIG.1
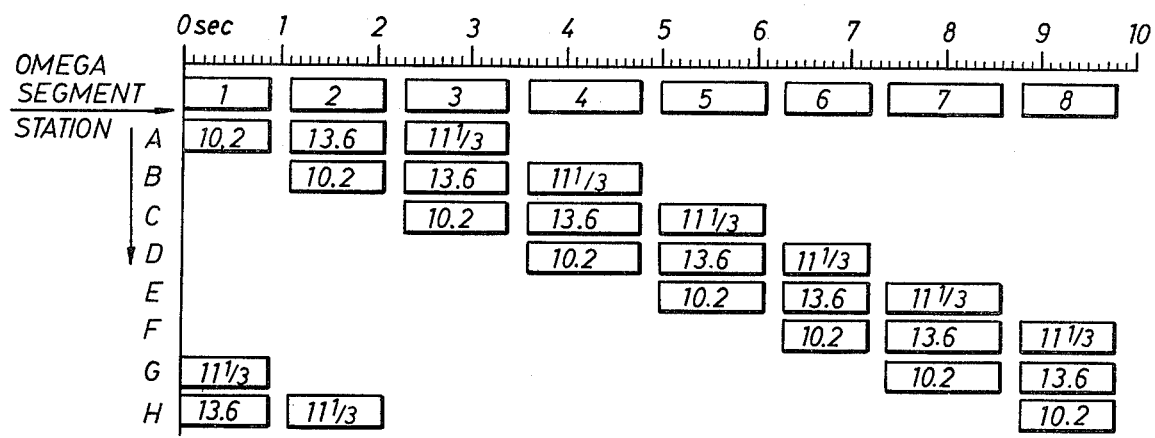
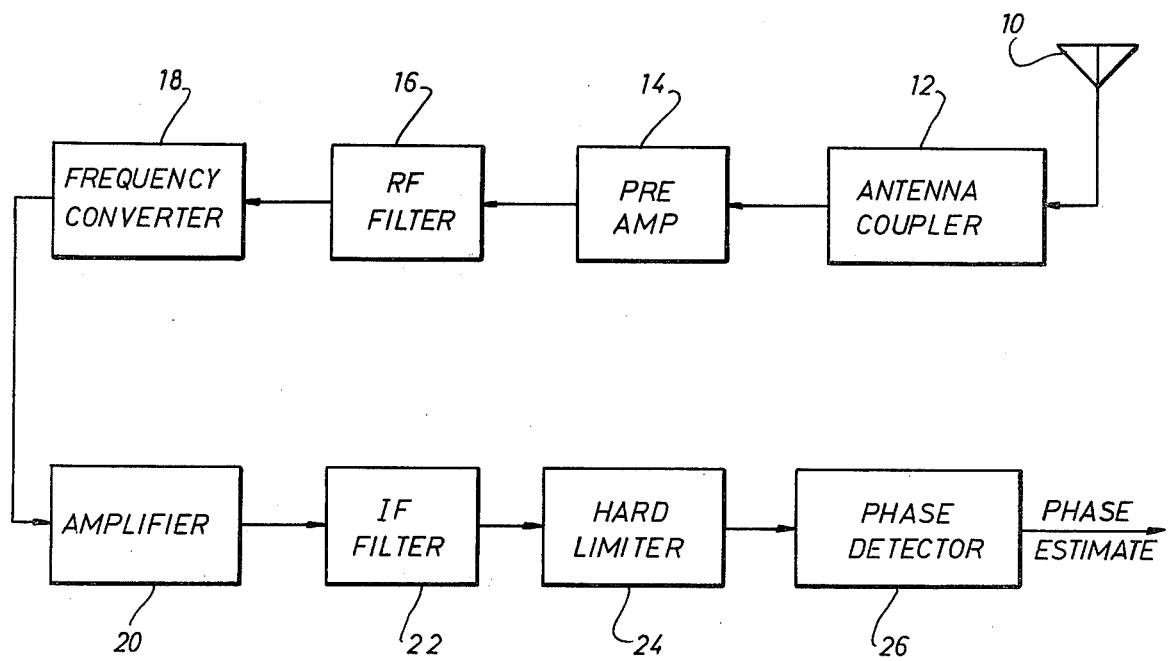
FIG.2

ND METHOD

BACKGROUND OF THE INVENTION

1. Field of the Invention

This invention relates to a device and method for detecting the phase of a signal at a known frequency and, more particularly, to a digital phase detector adapted for use with the Omega navigational system.

2. Description of the Prior Art

The Omega navigation system was developed in order to provide a means by which navigators may accurately determine their position from a location at any point on the earth. In operation, the Omega system utilizes eight transmitting stations which are located at points spaced over the entire earth. Each of these transmitting stations broadcasts signals at a very low frequency (VLF), on the order of ten kHz. Consequently, these signals have an effective range of five to eight thousand miles. With such a range, the signals from several of the eight Omega transmitting stations should be receivable at any location worldwide.

Each Omega station transmits a continuous wave signal at a known frequency within a discrete time interval. Each station's signal is synchronized with similar signals from the other Omega stations, each of the signals thereby occurring at a unique time in a recurring pattern. Equipped with the proper receiving and interpreting equipment, a navigator may identify the separate source of each received signal within the pattern and determine the relative phase relationship between each pair of such received signals. Points of constant phase difference between these pairs of signals will occur geographically along hyperbolic lines, and Omega navigation charts have been prepared with such hyperbolic lines of position plotted thereon. Using these charts and the phase information from the received Omega signals, a navigator can determine his current location very accurately.

Since the transmitted Omega signals do not provide synchronization or phase reference information, phase calculations at the receiver must be referenced to a local standard. Thus, an Omega receiver is designed to generate its own reference signal at the same frequency as the incoming Omega signal. The appropriate reference signal is then compared with each incoming Omega signal and the phase difference between the reference and the incoming signal is measured. From these preliminary phase measurements, the phase difference between any pair of incoming Omega signals may be calculated.

By transforming the phase information in the incoming Omega signal to binary form, the phase calculations may be conveniently accomplished with digital logic devices. One technique for digitally calculating the desired phase difference begins by filtering the incoming Omega signal, reducing that signal to an intermediate (IF) frequency, and then hard limiting the IF signal. The resulting square wave signal is compared with a reference square wave which is generated by the Omega receiver at the same IF frequency. In order to compare the phase of the Omega signal and the reference signal, the two signals are applied as the inputs of an exclusive-OR logic gate. With these inputs, the exclusive-OR gate will produce a first binary output when both input signals are at the same binary value, while the second binary output will be produced at a time when the input signals are at different binary values.

Thus, in effect, the exclusive-OR gate yields the product of multiplying the Omega signal and the reference signal.

The product output of the exclusive-OR gate controls the count direction of an up/down counter. The count which is accumulated in a given time interval will thus be related to the phase difference between the incoming signal and the reference signal, with the lowest count occurring when the signals are in phase, while the highest count will be registered when their phases differ by 180°. The registered count is then used as the error signal in a phase locked loop, which is applied to the reference generator to shift the phase of the reference signal so that it is approximately 90° from the phase of the next incoming Omega signal.

This digital phase detection technique works very satisfactorily for signals which are clean at the input to the hard limiter. For noisier signals, however, the sensitivity of such a phase detector will progressively degrade, and tracking error in the phase locked loop will ultimately build up to as much as one-fourth of a cycle if the phase of the Omega signal is changing. When the tracking error reaches one-fourth cycle, the loop characteristic ceases to be linear, and the loop will unlock, causing a loss of measurement fidelity.

In order to avoid such a phase locked loop error, the technique of quadrature signal processing may be applied to the phase measurement of an Omega signal. In the quadrature design, two phase detector circuits, each of which accomplishes a phase measurement in a manner similar to that of the phase locked loop detector design, are employed. As in the phase locked loop design, the quadrature detector applies a reference signal and the IF Omega signal to the inputs of an exclusive-OR gate.

In the quadrature design, however, two reference signals are generated, with one of the reference signals offset in phase from the other by 90°, i.e., the references are produced in quadrature. The Omega signal and the first reference signal are applied to the inputs of a first exclusive-OR gate, while the Omega signal and the 90° phase shifted reference are applied to the inputs of a second exclusive-OR gate. With this arrangement, one up/down counter will accumulate a sum which approximates the sine of the phase difference, while the second up/down counter will register a count which represents the cosine of the phase difference. The phase difference value may then be obtained by calculating the arc tangent of the ratio of these two sums.

In actuality, the sums which are measured are strictly sinusoidal as a function of phase difference only at low signal-to-noise ratios, but approach triangular functions at high signal-to-noise ratios. Thus, the measurements which are obtained may more accurately be referred to as the pseudo-sine and the pseudo-cosine. The approximation, however, is sufficiently close that accurate phase measurements may be obtained by utilizing an appropriate pseudo-arctangent function or even a true arc tangent function. Furthermore, this method of digital phase detection will not degrade in sensitivity as the signal-to-noise ratio decreases, as occurs with the phase locked loop technique discussed above.

The quadrature method of phase detection yields sufficiently accurate results when employed, for navigation purposes, to provide an accurate indication of the location of the Omega receiver. The signals transmitted in the Omega navigation system, however, have proven useful in making additional important measurements. One area in which the Omega signals are potentially of significant utility is meteorology. It is often desirable in the study of weather to chart the speed and direction of the wind over a period of time for various locations about the earth, and at various altitudes over those locations. These measurements may be conveniently obtained using the Omega system.

In order to make such wind finding measurements, instrumented weather balloons are released at diverse locations and allowed to rise through the atmosphere. After a balloon has been released, it will travel with a horizontal component of motion having substantially the same speed and direction as that of the wind at the balloon's location. Instrumentation aboard the balloon transmits its altitude as a function of time. Using the Omega signals, information may also be obtained as to the balloon's horizontal location as a function of time and as to the balloon's speed and direction of travel.

An Omega receiver mounted on the balloon may be designed to retransmit the received signals to a ground station. The ground equipment will then detect phase difference information in a manner similar to that utilized in navigating, as discussed above. Thus the balloon's location may be derived and recorded as a function of time. Furthermore, by detecting the time rate of change of the phase differences between the Omega signals received by the balloon, the speed and direction of travel of the balloon, which may be assumed to correspond to the wind speed and direction at the balloon's location, may be computed. Although the quadrature phase detection technique discussed above produces an arc tangent result which differs by only a few degrees from the phase of the original signal, and although this difference occurs only at high signal-to-noise ratios, this error is detrimental where a highly accurate measurement is required, such as is necessary when computing the time rate of change of the phase difference in the wind finding technique. Consequently, a need has developed in the art for a phase detection device which employs a method which will provide phase difference measurements of increased accuracy.

Therefore, it is a feature of this invention to provide an improved phase detector which is capable of highly accurate measurements of phase difference.

It is another feature of this invention to provide an improved phase detector which is sufficiently accurate to permit the accurate measurement of the time rate of change of phase difference.

It is another feature of this invention to provide an improved phase detector which may be programmed to incorporate digital correction factors into quadrature phase detection circuitry.

It is also a feature of this invention to provide an improved phase detector with which the Omega navigation system may be utilized to perform wind finding measurements.

SUMMARY OF THE INVENTION

A digital phase detector includes a hard limiter which transforms an incoming signal of known frequency into a square wave. A reference generator produces a reference square wave and a 90° phase-shifted reference square wave, each having the frequency of the incoming signal. The signal square wave is combined in a first logic element with the reference square wave and in a second logic element with the 90° phase-shifted reference square wave. A phase modulated clock drives two counters controlled by the outputs of the first and second logic elements, with the first counter controlled by the first output and the second counter controlled by the second output. A digital processor computes an estimate of the signal phase using the counts registered in the first and second counters.

In a preferred embodiment, the phase modulated clock of the invention includes a high speed digital clock which drives a programmable divider. A read only memory is connected to control the division ratio of the programmable divider, while a counter receives the output from the programmable divider and addresses the read only memory.

BRIEF DESCRIPTION OF THE DRAWINGS

The appended drawings, which form a part of the specification, illustrate one preferred embodiment of the invention and thereby clarify the features, advantages, and objects which are achieved. It should be noted, however, that the drawings present only a typical embodiment of the invention and, therefore, should not be considered to limit its scope, since the inventive concept may be realized in other equally effective embodiments.

In the drawings:

FIG. 1 is an illustration of the OMEGA navigation system signal format.

FIG. 2 is an illustration in block diagram form of a typical Omega receiver.

DESCRIPTION OF THE PREFERRED EMBODIMENT

Figure 3:
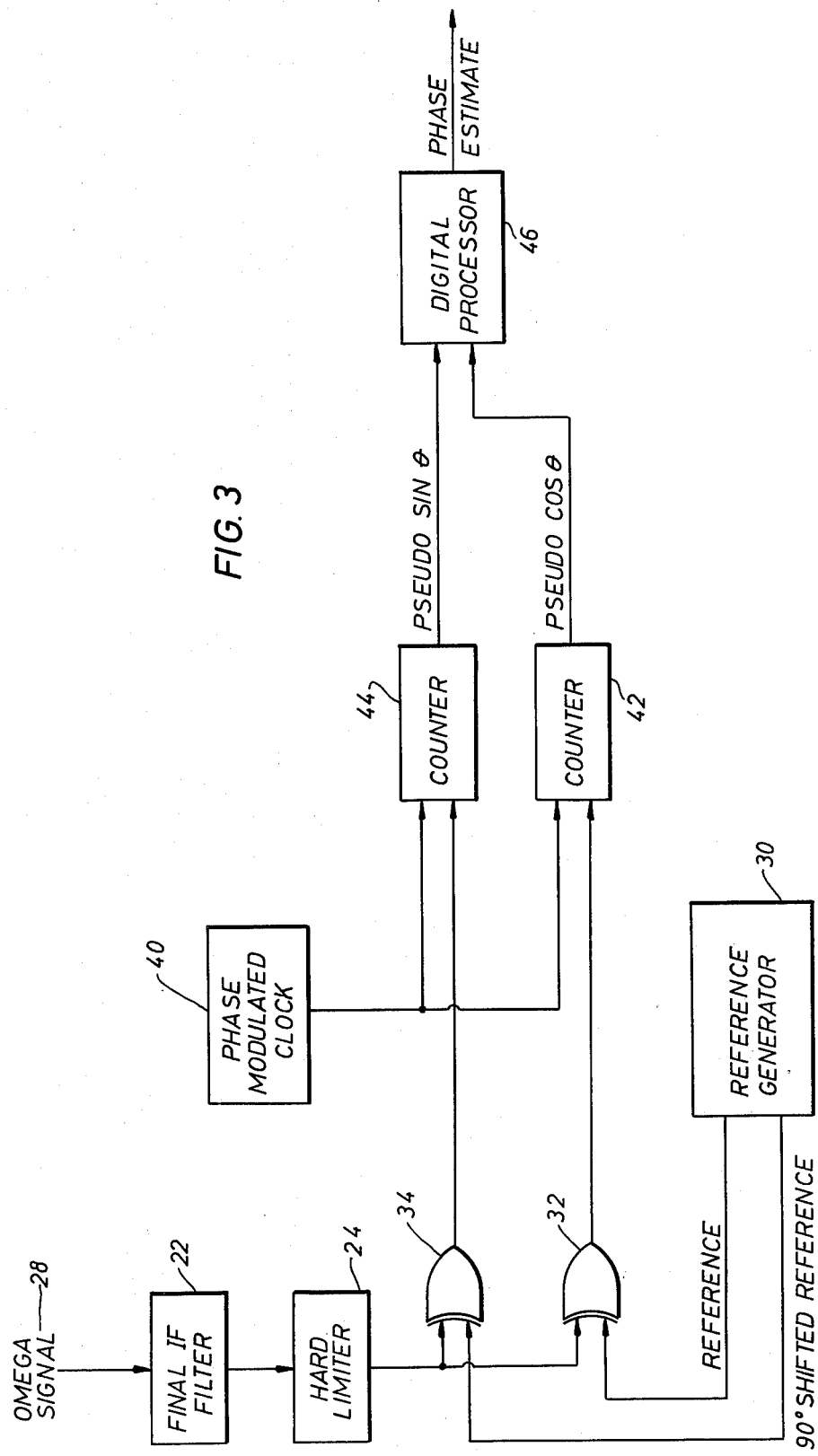
FIG. 3 is a block diagram of a digital phase detector operating in accordance with the present invention.

Although the phase detector and method here disclosed are applicable to any system in which the phase of a discrete signal at a known frequency must be measured, the technique will be herein described with reference to the Omega navigational system.

The Omega hyperbolic navigation system utilizes the sequential transmission of three navigation frequencies (at 10.2, 11⅓, and 13.6 kHz) from each of eight transmitters spaced around the world. The multiple frequencies are used for reducing the lane ambiguity problem associated with the phase measurement of an essentially continuous phase signal.

Referring to FIG. 1, the basic Omega signal format is illustrated, the eight transmitting stations being shown along the ordinate of the graph and the time sequence and duration of the transmissions being depicted on the abscissa. Frequency $F_1$ (10.2 kHz in the Omega system) is broadcast by station A at time T equal to zero. This signal is broadcast for 0.9 second, followed by a 0.2 second delay, such a delay being present between each pair of transmitted signals. At time T equals 1.1 seconds, station A transmits frequency $F_2$ at 13.6 kHz, and at time T equals 2.3 seconds, station A broadcasts frequency $F_3$, corresponding in the Omega system to 11⅓ kHz. Station B commences its broadcast of frequency $F_1$ at time T equal to 1.1 seconds, commences its broadcast of frequency $F_2$ at time T equal to 2.3 seconds, and commences its broadcast of frequency $F_3$ at time T equal to 3.6 seconds. Frequency $F_1$ was broadcast by station A for a total time of 0.9 second, while station B broadcasts frequency $F_1$ for a total time of 1 second and station B broadcasts frequency $F_2$ for a total time of 1.1 seconds. Thus, by knowing the sequence of frequencies to be transmitted, together with the time of duration of each of the three discrete signals, a particular station can be identified. As illustrated in FIG. 1, there are eight segments in the 10 second signal format time, the full 10 seconds elapsing between the commencement of the transmission of each discrete frequency of each station. The present description of the device and method of the invention will be confined to one sequence of signals transmitted on one frequency from one transmitter, although it should be understood that the device and method are equally applicable to any station and any frequency.

Now referring to FIG. 2, there is illustrated in block diagram form a portion of a typical Omega receiver for receiving the broadcast Omega signal being transmitted on one of the three discrete frequencies. The signal is initially received by an antenna 10 and passes from the antenna through an antenna coupler 12 to suitable electronic processing devices. Preamplifier 14 amplifies the signal and passes it to RF filter 16, from which the filtered signal passes into frequency converter 18. In frequency converter 18, the signal is transposed to a lower frequency, such as 200 Hz, then passed to amplifier 20. The intermediate frequency (IF) signal is amplified and then filtered in IF filter 22. Hard limiter 24 is a limiting amplifier which converts the IF signal to a square wave at the same frequency. The signal from hard limiter 24 is then processed in digital form by phase detector 26, which produces an estimate of the input signal's phase.

Now referring to FIG. 3, a digital phase detector utilizing the quadrature technique in accordance with the present invention is illustrated in block diagram form. An incoming processed Omega signal 28 is shown entering a final IF filter stage 22 after it has been initially processed by an Omega receiver, in the manner illustrated in FIG. 2. After final IF filtering, the signal 28 is converted to a square wave by hard limiter 24. At this point, the Omega signal may be treated as a binary signal and processed by digital logic elements.

A reference generator 30 produces two reference square waves, each at the frequency of the Omega signal 28. The first reference square wave is applied as an input to exclusive-OR gate 32, as is the Omega signal. The second reference square wave, which is produced by the reference generator 30 with a phase delay of 90° with respect to the first reference square wave, is applied to exclusive-OR gate 34, to which the Omega signal is also applied as an input.

Exclusive-OR gates 32 and 34 represent a multiplication function. An exclusive-OR gate will produce a binary "0" output at a time when both of its inputs are binary "1" or both are binary "0". The exclusive-OR gate produces a binary "1" output at any time that its inputs are at different binary values, i.e., binary "1" and "0", or "0" and "1". The product output of exclusive-OR gate 32 is applied to counter 42, while the product output of exclusive-OR gate 34 is applied to counter 44. Low-pass filtering of the exclusive-OR outputs is achieved by using those outputs to control the direction in which up/down counters 42 and 44 count when driven by a clock signal from phase modulated clock 40.

Although the phase function on which the phase detector operates is not actually sinusoidal, but triangular, the counts registered in counters 42 and 44 are analogous to the cosine and sine of the phase difference, respectively. These measurements may thus be conveniently designated as the pseudo-cosine and pseudo-sine. By taking the ratio of these measurements and applying an arc tangent function to that ratio, an estimate of the difference in phase between the Omega signal and the reference may be calculated. This calculation is accomplished in digital processor 46.

Counters 42 and 44, however, need not be up/down counters. An equivalent result may be more economically obtained by using unidirectional counters. In the embodiment discussed above, each up/down counter counts on every clock pulse, with the direction of the count determined by the corresponding exclusive-OR gate. In other words, such a counter counts either $+1$ or $-1$ at each pulse. When unidirectional counters are employed, such counters are operably connected in such a manner that each counter either counts or does not count at each pulse, depending upon the output of the corresponding exclusive-OR gate. Thus a unidirectional counter will count either $+1$ or 0. These values may be considered as counts of $+\frac{1}{2}$ and $-\frac{1}{2}$, respectively, which occur simultaneously with a count of $+\frac{1}{2}$.

Therefore, if the duration of the counting interval is known, the equivalent counts for an up/down counter may be obtained in digital processor 46 by doubling each result and then subtracting an offset which is equal to the known number of clock pulses which could have been counted. Although either up/down or unidirectional counters will thus produce the same results in the invention, the remainder of this description will assume for convenience that up/down counters are used.

Figure 4:
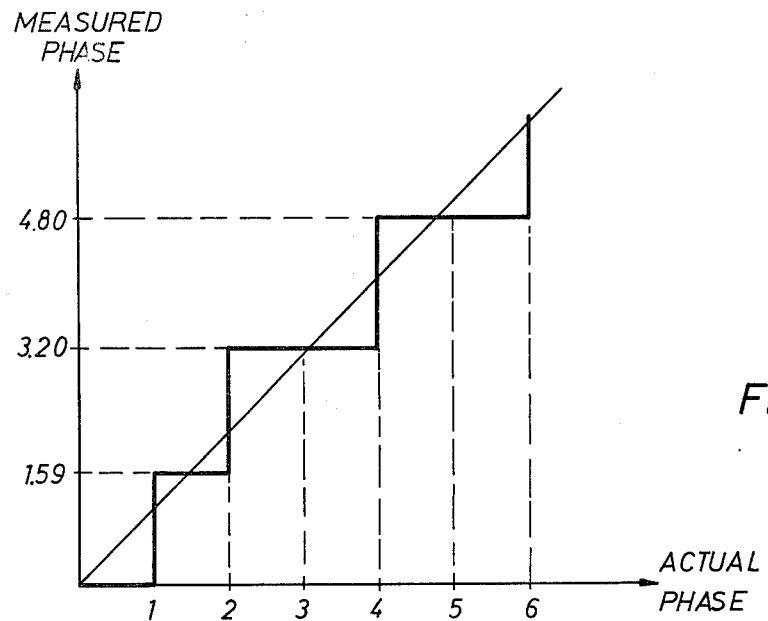
FIG. 4 is a graphical depiction of the relationship between the actual signal phase and the phase value as measured by a digital phase detector.

The novelty and advantage of the present invention resides in the use of a phase modulated clock 40 to drive the counters 42 and 44. The need for a correction factor in a digital phase detector may be illustrated graphically as in FIG. 4. FIG. 4 is a plot showing the relationship of the actual signal phase to the phase of the signal as measured by a digital phase detector. For an ideal detector, this relationship would be indicated by a straight line. Because of the quantization of the counters which form the vector reading, however, only certain values of phase will be measured by a digital detector. The values which will be measured are indicated on the vertical axis in units of 1.024 MHz clock periods. In order to minimize the error in the value of phase which is measured, the phase detector circuitry should be designed so as to cause a transition from one quantized measured phase value to the next at every appropriate point to minimize the discrepancy between the measured and actual phase for the next clock period. One way in which such a corrected transition may be accomplished is by modulating the phase of the clock 40 which is used to gate the signals in the quadrature type of digital phase detector. Such a technique is illustrated in further detail in FIG. 5.

Figure 5:
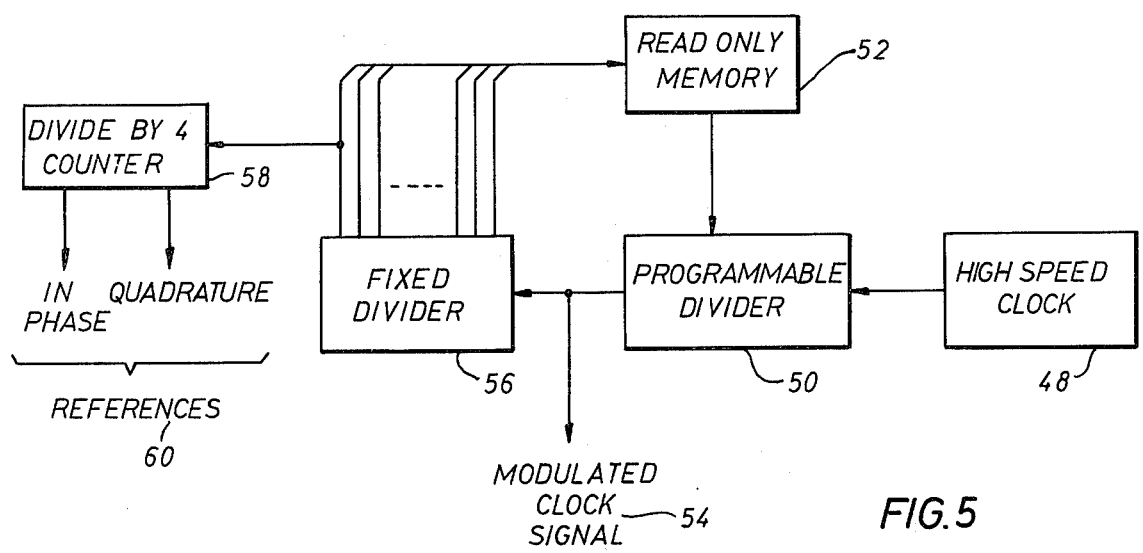
FIG. 5 is a block diagram illustrating a preferred embodiment of the phase modulated clock utilized in the digital phase detector depicted in FIG. 3.

FIG. 5 depicts in block diagram form the phase modulated clock 40 of FIG. 3. High speed clock 48 is used to drive programmable divider 50. Read only memory 52 controls the ratio by which programmable divider 50 divides high speed clock 48 to generate phase modulated clock signal 54. By controlling the divider in this manner, the modulated clock signal 54, which is obtained as the output of programmable divider 50, actually counts at a varying rate which may be precisely specified by the contents loaded into read only memory 52. When modulated clock signal 54 is utilized to control counters 42 and 44 in FIG. 3, the counters may be caused to fluctuate in a desirable manner so that the count registered will yield the most accurate estimate of the measured signal phase for each actual phase value. The output from programmable divider 50 is applied to fixed divider 56. Fixed divider 56 then will sequentially count to the next higher binary value, and that binary value is used to address the corresponding location in read only memory 52. The contents will then specify the next division ratio to be used by programmable divider 50.

The function of programmable divider 50 may alternatively be performed by a presettable counter which is loaded from read only memory 52 each time the counter reaches its terminal count. When such a counter is used, read only memory 52 contains those values which will cause the counter to reach its terminal count at the same times at which programmable divider 50 would produce its output pulses, rather than the division ratios themselves. Either embodiment will yield the same result, but for clarity the remainder of the description of the preferred embodiment will assume the use of a programmable divider.

In order to provide the appropriate error correction values for the phase detector, a correction factor is computed for the error which will be present at each pulse of the clock. This calculation may be accomplished by computing the arc tangent function and determining the value which will be produced by that function for each possible value of phase difference. The number of clock pulses which will be necessary to obtain the sums in counters 42 and 44 corresponding to that output value of phase from digital processor 46 may then be calculated, and an appropriate binary count value loaded into the appropriate address of read only memory 52. In actuality, the error which occurs has been found to be repetitive for each 90° of phase. Therefore, it is only necessary to compute correction factors over a phase difference range of 0° to 90°, and load appropriate binary timing values into read only memory 52. The read only memory may then be addressed through its entire contents four times for each 360° of phase.

In the preferred embodiment of the invention illustrated a high speed clock 48 counting at a 1.024 MHz rate is utilized. The average counting rate of the modulated clock signal output is 409.6 kHz. Thus, on the average, the read only memory values divide the high frequency clock rate by a factor of 2.5. Individual clock pulses, however, are divided by a factor of 1, 2, 3, or 4, as required by the necessary correction for each phase value. A complete listing of the read only memory contents which will accomplish this correction is contained in Table I. Table I contains each address of the read only memory and the corresponding division ratio which is located at that address.

TABLE I

| Address | Contents | Address | Contents | Address | Contents |
|---|---|---|---|---|---|
| 0 | 2 | 56 | 2 | 112 | 3 |
| 1 | 1 | 57 | 2 | 113 | 2 |
| 2 | 2 | 58 | 2 | 114 | 3 |
| 3 | 2 | 59 | 2 | 115 | 2 |
| 4 | 1 | 60 | 2 | 116 | 2 |
| 5 | 2 | 61 | 2 | 117 | 3 |
| 6 | 1 | 62 | 2 | 118 | 2 |
| 7 | 2 | 63 | 2 | 119 | 3 |
| 8 | 2 | 64 | 2 | 120 | 2 |
| 9 | 1 | 65 | 2 | 121 | 3 |
| 10 | 2 | 66 | 2 | 122 | 2 |

TABLE I-continued

| Address | Contents | Address | Contents | Address | Contents |
|---|---|---|---|---|---|
| 11 | 2 | 67 | 2 | 123 | 3 |
| 12 | 1 | 68 | 2 | 124 | 2 |
| 13 | 2 | 69 | 2 | 125 | 3 |
| 14 | 2 | 70 | 2 | 126 | 2 |
| 15 | 1 | 71 | 2 | 127 | 3 |
| 16 | 2 | 72 | 2 | 128 | 2 |
| 17 | 2 | 73 | 2 | 129 | 3 |
| 18 | 2 | 74 | 2 | 130 | 3 |
| 19 | 1 | 75 | 3 | 131 | 2 |
| 20 | 2 | 76 | 2 | 132 | 3 |
| 21 | 2 | 77 | 2 | 133 | 2 |
| 22 | 1 | 78 | 2 | 134 | 3 |
| 23 | 2 | 79 | 2 | 135 | 3 |
| 24 | 2 | 80 | 2 | 136 | 2 |
| 25 | 2 | 81 | 2 | 137 | 3 |
| 26 | 1 | 82 | 3 | 138 | 2 |
| 27 | 2 | 83 | 2 | 139 | 3 |
| 28 | 2 | 84 | 2 | 140 | 3 |
| 29 | 2 | 85 | 2 | 141 | 2 |
| 30 | 2 | 86 | 2 | 142 | 3 |
| 31 | 1 | 87 | 3 | 143 | 3 |
| 32 | 2 | 88 | 2 | 144 | 2 |
| 33 | 2 | 89 | 2 | 145 | 3 |
| 34 | 2 | 90 | 2 | 146 | 3 |
| 35 | 2 | 91 | 3 | 147 | 2 |
| 36 | 1 | 92 | 2 | 148 | 3 |
| 37 | 2 | 93 | 2 | 149 | 3 |
| 38 | 2 | 94 | 2 | 150 | 2 |
| 39 | 2 | 95 | 3 | 151 | 3 |
| 40 | 2 | 96 | 2 | 152 | 3 |
| 41 | 2 | 97 | 2 | 153 | 3 |
| 42 | 2 | 98 | 3 | 154 | 2 |
| 43 | 1 | 99 | 2 | 155 | 3 |
| 44 | 2 | 100 | 2 | 156 | 3 |
| 45 | 2 | 101 | 3 | 157 | 3 |
| 46 | 2 | 102 | 2 | 158 | 2 |
| 47 | 2 | 103 | 2 | 159 | 3 |
| 48 | 2 | 104 | 3 | 160 | 3 |
| 49 | 2 | 105 | 2 | 161 | 3 |
| 50 | 2 | 106 | 2 | 162 | 3 |
| 51 | 2 | 107 | 3 | 163 | 2 |
| 52 | 2 | 108 | 2 | 164 | 3 |
| 53 | 2 | 109 | 2 | 165 | 3 |
| 54 | 2 | 110 | 3 | 166 | 3 |
| 55 | 2 | 111 | 2 | 167 | 3 |
| 168 | 3 | 225 | 3 | 281 | 3 |
| 169 | 2 | 226 | 4 | 282 | 3 |
| 170 | 3 | 227 | 3 | 283 | 3 |
| 171 | 3 | 228 | 3 | 284 | 3 |
| 172 | 3 | 229 | 3 | 285 | 3 |
| 173 | 3 | 230 | 3 | 286 | 4 |
| 174 | 3 | 231 | 3 | 287 | 3 |
| 175 | 3 | 232 | 3 | 288 | 3 |
| 176 | 3 | 233 | 4 | 289 | 3 |
| 177 | 3 | 234 | 3 | 290 | 3 |
| 178 | 2 | 235 | 3 | 291 | 3 |
| 179 | 3 | 236 | 3 | 292 | 3 |
| 180 | 3 | 237 | 3 | 293 | 4 |
| 181 | 3 | 238 | 3 | 294 | 3 |
| 182 | 3 | 239 | 4 | 295 | 3 |
| 183 | 3 | 240 | 3 | 296 | 3 |
| 184 | 3 | 241 | 3 | 297 | 3 |
| 185 | 3 | 242 | 3 | 298 | 3 |
| 186 | 3 | 243 | 3 | 299 | 3 |
| 187 | 3 | 244 | 3 | 300 | 3 |
| 188 | 3 | 245 | 4 | 301 | 3 |
| 189 | 3 | 246 | 3 | 302 | 3 |
| 190 | 3 | 247 | 3 | 303 | 3 |
| 191 | 3 | 248 | 3 | 304 | 4 |
| 192 | 3 | 249 | 3 | 305 | 3 |
| 194 | 3 | 250 | 3 | 306 | 3 |
| 195 | 3 | 251 | 4 | 307 | 3 |
| 196 | 3 | 252 | 3 | 308 | 3 |
| 197 | 3 | 253 | 3 | 309 | 3 |
| 198 | 3 | 254 | 3 | 310 | 3 |
| 199 | 3 | 255 | 3 | 311 | 3 |
| 200 | 3 | 256 | 4 | 312 | 3 |
| 201 | 3 | 257 | 3 | 313 | 3 |
| 202 | 3 | 258 | 3 | 314 | 3 |
| 203 | 3 | 259 | 3 | 315 | 3 |
| 204 | 3 | 260 | 3 | 316 | 3 |

TABLE I-continued

| Address | Contents | Address | Contents | Address | Contents |
|---|---|---|---|---|---|
| 205 | 3 | 261 | 4 | 317 | 3 |
| 206 | 3 | 262 | 3 | 318 | 3 |
| 207 | 3 | 263 | 3 | 319 | 3 |
| 208 | 4 | 264 | 3 | 320 | 3 |
| 209 | 3 | 265 | 3 | 321 | 3 |
| 210 | 3 | 266 | 3 | 322 | 3 |
| 211 | 3 | 267 | 4 | 323 | 3 |
| 212 | 3 | 268 | 3 | 324 | 3 |
| 213 | 3 | 269 | 3 | 325 | 3 |
| 214 | 3 | 270 | 3 | 326 | 3 |
| 215 | 3 | 271 | 3 | 327 | 3 |
| 216 | 3 | 272 | 3 | 328 | 3 |
| 217 | 3 | 273 | 4 | 329 | 3 |
| 218 | 3 | 274 | 3 | 330 | 3 |
| 219 | 4 | 275 | 3 | 331 | 3 |
| 220 | 3 | 276 | 3 | 332 | 3 |
| 221 | 3 | 277 | 3 | 333 | 3 |
| 222 | 3 | 278 | 3 | 334 | 2 |
| 223 | 3 | 279 | 4 | 335 | 3 |
| 224 | 3 | 280 | 3 | 336 | 3 |
| 337 | 3 | 393 | 3 | 449 | 2 |
| 338 | 3 | 394 | 2 | 450 | 2 |
| 339 | 3 | 395 | 3 | 451 | 2 |
| 340 | 3 | 396 | 2 | 452 | 2 |
| 341 | 3 | 397 | 2 | 453 | 2 |
| 342 | 3 | 398 | 3 | 454 | 2 |
| 343 | 2 | 399 | 2 | 455 | 2 |
| 344 | 3 | 400 | 3 | 456 | 2 |
| 345 | 3 | 401 | 2 | 457 | 2 |
| 346 | 3 | 402 | 3 | 458 | 2 |
| 347 | 3 | 403 | 2 | 459 | 2 |
| 348 | 3 | 404 | 2 | 460 | 2 |
| 349 | 2 | 405 | 3 | 461 | 2 |
| 350 | 3 | 406 | 2 | 462 | 2 |
| 351 | 3 | 407 | 2 | 463 | 2 |
| 352 | 3 | 408 | 3 | 464 | 2 |
| 353 | 3 | 409 | 2 | 465 | 2 |
| 354 | 2 | 410 | 2 | 466 | 2 |
| 355 | 3 | 411 | 3 | 467 | 2 |
| 356 | 3 | 412 | 2 | 468 | 2 |
| 357 | 3 | 413 | 2 | 469 | 1 |
| 358 | 2 | 414 | 3 | 470 | 2 |
| 359 | 3 | 415 | 2 | 471 | 2 |
| 360 | 3 | 416 | 2 | 472 | 2 |
| 361 | 3 | 417 | 3 | 473 | 2 |
| 362 | 2 | 418 | 2 | 474 | 2 |
| 363 | 3 | 419 | 2 | 475 | 2 |
| 364 | 3 | 420 | 2 | 476 | 1 |
| 365 | 2 | 421 | 3 | 477 | 2 |
| 366 | 3 | 422 | 2 | 478 | 2 |
| 367 | 3 | 423 | 2 | 479 | 2 |
| 368 | 2 | 424 | 2 | 480 | 2 |
| 369 | 3 | 425 | 3 | 481 | 1 |
| 370 | 3 | 426 | 2 | 482 | 2 |
| 371 | 2 | 427 | 2 | 483 | 2 |
| 372 | 3 | 428 | 2 | 484 | 2 |
| 373 | 3 | 429 | 2 | 485 | 2 |
| 374 | 2 | 430 | 3 | 486 | 1 |
| 375 | 3 | 431 | 2 | 487 | 2 |
| 376 | 2 | 432 | 2 | 488 | 2 |
| 377 | 3 | 433 | 2 | 489 | 2 |
| 378 | 3 | 434 | 2 | 490 | 1 |
| 379 | 2 | 435 | 2 | 491 | 2 |
| 380 | 3 | 436 | 2 | 492 | 2 |
| 381 | 2 | 437 | 3 | 493 | 1 |
| 382 | 3 | 438 | 2 | 494 | 2 |
| 383 | 3 | 439 | 2 | 495 | 2 |
| 384 | 2 | 440 | 2 | 496 | 2 |
| 385 | 3 | 441 | 2 | 497 | 1 |
| 386 | 2 | 442 | 2 | 498 | 2 |
| 387 | 3 | 443 | 2 | 499 | 2 |
| 388 | 2 | 444 | 2 | 500 | 1 |
| 389 | 3 | 445 | 2 | 501 | 2 |
| 390 | 2 | 446 | 2 | 502 | 2 |
| 391 | 3 | 447 | 2 | 503 | 1 |
| 392 | 2 | 448 | 2 | 504 | 2 |
|  |  |  |  | 505 | 2 |
|  |  |  |  | 506 | 1 |
|  |  |  |  | 507 | 2 |
|  |  |  |  | 508 | 1 |
|  |  |  |  | 509 | 2 |
|  |  |  |  | 510 | 2 |
|  |  |  |  | 511 | 1 |

In the embodiment illustrated in FIG. 5, fixed divider 56 is 9-bit binary counter, which therefore divides the frequency of modulated clock signal 54 by 512. By combining divide-by-4 counter 58 with fixed divider 56, the reference outputs 60 are obtained at a frequency of 200 Hz. In this manner, the phase modulated clock 40 in FIG. 3 may be used to act as a reference generator 30 and produce the necessary reference signals.

It may also be seen in FIG. 5 that, since fixed divider 56 addresses read only memory 52, memory 52 is programmed with 512 memory locations.

While the method and device of this invention has been discussed herein with respect to one preferred embodiment of that invention, it will be appreciated by those skilled in the art that the novel features of this invention may be expressed in many other embodiments. For example, although the invention has been discussed with respect to a digital phase detector design particularly adapted for use with the Omega navigation system, the invention may be equally advantageous when used in conjunction with digital phase detection for other uses. Also, as discussed more fully above, either up/down counters or unidirectional counters may be utilized in the digital phase detector, while the programmable divider may be replaced by a presettable counter, as will be recognized by those skilled in the art.

What is claimed is:

1. A digital phase detector, comprising:
    a hard limiter, operably connected to an incoming signal of known frequency to produce a signal square wave having said frequency;
    a reference generator, said generator producing a reference square wave and a 90° phase shifted reference square wave, each having said known frequency;
    a first logic element operably connected to produce a multiplicative output from the input of said signal square wave and said reference square wave;
    a second logic element operably connected to produce a multiplicative output from the input of said signal square wave and said 90° phase shifted reference square wave;
    a phase modulated clock;
    a first counter operably connected to count said phase modulated clock under control of the output from said first logic element;
    a second counter operably connected to count said phase modulated clock under control of the output from said second logic element; and
    a digital processor, said processor operably connected to compute a phase estimate from the counts registered by said first and second counters.

2. The phase detector of claim 1, wherein:
    said first logic element is an exclusive-OR gate; and
    said second logic element is an exclusive-OR gate.

3. The phase detector of claim 1, wherein said first and second logic elements comprise:
    exclusive-NOR gates.

4. The phase detector of claim 1, wherein said first and second counters comprise:

bidirectional counters whose counting direction is controlled by the outputs of said first and second logic elements, respectively.

5. The phase detector of claim 1, wherein said first and second counters comprise:
   unidirectional counters whose counting of said phase modulated clock is enabled and disabled by the outputs of said first and second logic elements, respectively.

6. The phase detector of claim 1, wherein:
   the count of said first counter is equivalent to the pseudo-sine of the phase angle of said signal;
   the count of said second counter is equivalent to the pseudo-cosine of the phase angle of said signal; and
   said digital processor utilizes an arc tangent function to compute said phase estimate from the ratio of said counts.

7. The phase detector of claim 1, wherein said phase modulated clock comprises:
   a high speed digital clock;
   a programmable divider driven by said high speed clock which outputs a modulated clock signal to drive said first and second counters;
   a read only memory operably connected to control the division ratio of said programmable divider with phase-modulating values; and
   a fixed divider operably connected to count upon receipt of an output from said programmable divider and address the next location in said read only memory.

8. The phase detector of claim 7, wherein:
   said read only memory is loaded with values such that said counters are forced to count at a varying rate.

9. The phase detector of claim 8, wherein:
   said read only memory is loaded with binary values substantially as specified in Table I.

10. The phase detector of claim 8, wherein:
    said values are arranged so as to minimize the discrepancy between the phase difference measured by said phase detector and the actual phase difference.

11. The phase detector of claim 7, wherein said reference generator comprises:
    a reference counter operably connected to the output of said fixed divider to divide said output and thereby produce said reference square wave and said 90° phase shifted reference square wave.

12. A phase modulated clock modulated according to a predetermined modulation function for use in a digital phase detector, said clock comprising:
    a read only memory loaded with clock rate correction factors, said correction factors controlling the placement of each phase modulated clock pulse to minimize the phase error between the modulated clock phase and the phase according to the modulation function;
    a high speed clock;
    a programmable divider operably connected to said read only memory and said high speed clock, for generating the phase modulated clock pulses by counting high speed clock pulses in a varying rate according to said clock rate correction factors; and
    a fixed divider operably connected to said programmable divider and said read only memory, said fixed divider addressing the appropriate location in said read only memory at each output pulse from said programmable divider.

13. The clock of claim 12, further comprising:
    a reference counter operably connected to the output of said fixed divider, said reference counter adapted to divide said output and thereby provide a reference square wave and a 90° shifted reference square wave for said phase detector.

14. A method of detecting a phase difference, comprising the steps of:
    hard limiting an incoming signal of known frequency;
    combining the signal with a reference square wave at the same frequency to produce a first multiplicative output;
    combining the signal with a 90° phase shifted reference square wave at the same frequency to produce a second multiplicative output;
    gating a phase modulated clock by said first and second multiplicative outputs to generate first and second gated phase modulated clock pulses, respectively;
    separately counting said gated phase modulated clock pulses; and
    applying an arctangent function to the ratio of said counts.

15. The method of claim 14, wherein said phase modulated clock pulses are produced by the steps of:
    counting at a high speed clock rate;
    selecting a stored clock rate correction factor; and
    dividing said high speed clock rate by said correction factor to produce a phase modulated clock pulse.

16. The method of claim 14, wherein:
    said first multiplicative output is an exclusive-OR output; and
    said second multiplicative output is an exclusive-OR output.

17. The method of claim 14, wherein:
    said first multiplicative output is an exclusive-NOR output; and
    said second multiplicative output is an exclusive-NOR output.

* * * * *

UNITED STATES PATENT AND TRADEMARK OFFICE
CERTIFICATE OF CORRECTION

PATENT NO. : 4,178,631
DATED : December 11, 1979
INVENTOR(S) : Robert L. Nelson, Jr.

It is certified that error appears in the above-identified patent and that said Letters Patent are hereby corrected as shown below:

In the heading, the name of Assignee, delete "Tractor" and insert --Tracor--.

Signed and Sealed this

Nineteenth Day of August 1980

[SEAL]

Attest:

SIDNEY A. DIAMOND

Attesting Officer

Commissioner of Patents and Trademarks